US006998691B2

(12) United States Patent
Baugh et al.

(10) Patent No.: US 6,998,691 B2
(45) Date of Patent: Feb. 14, 2006

(54) OPTOELECTRONIC DEVICE PACKAGING WITH HERMETICALLY SEALED CAVITY AND INTEGRATED OPTICAL ELEMENT

(75) Inventors: Brenton A. Baugh, Palo Alto, CA (US); Tanya J. Snyder, Edina, MN (US); Kendra Gallup, Marina Del Ray, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 152 days.

(21) Appl. No.: 10/666,091

(22) Filed: Sep. 19, 2003

(65) Prior Publication Data

US 2005/0062056 A1 Mar. 24, 2005

(51) Int. Cl.
*H01L 21/76* (2006.01)

(52) U.S. Cl. .......................... 257/433; 257/432; 438/69

(58) Field of Classification Search ................. 257/431, 257/432, 433, 704, 81, 98; 372/43, 29, 33; 438/65, 69, 7, 16, 27, 29, 72

See application file for complete search history.

(56) References Cited

U.S. PATENT DOCUMENTS

| | | | | | |
|---|---|---|---|---|---|
| 4,847,848 | A | * | 7/1989 | Inoue et al. | 372/50 |
| 5,578,863 | A | * | 11/1996 | De Poorter | 257/433 |
| 5,665,982 | A | * | 9/1997 | Torikai | 257/81 |
| 5,801,402 | A | * | 9/1998 | Shin | 257/80 |
| 5,835,514 | A | * | 11/1998 | Yuen et al. | 372/36 |
| 5,875,205 | A | | 2/1999 | Spaeth et al. | |
| 5,981,945 | A | | 11/1999 | Spaeth et al. | |
| 6,228,675 | B1 | | 5/2001 | Ruby et al. | |
| 6,265,246 | B1 | | 7/2001 | Ruby et al. | |
| 6,376,280 | B1 | | 4/2002 | Ruby et al. | |
| 6,429,511 | B2 | | 8/2002 | Ruby et al. | |
| 6,556,608 | B1 | | 4/2003 | Gilliland et al. | |
| 6,686,580 | B1 | * | 2/2004 | Glenn et al. | 250/208.1 |
| 6,774,404 | B2 | * | 8/2004 | Imai | 257/98 |
| 2003/0116825 | A1 | | 6/2003 | Geefay et al. | |
| 2003/0119308 | A1 | | 6/2003 | Geefay et al. | |
| 2004/0086011 | A1 | * | 5/2004 | Bhandarkar | 372/43 |

OTHER PUBLICATIONS

Chien Chieh Lee et al., “Silicon Based Transmissive Diffractive Optical Element”, Optics Letters, vol. 28, No. 14, Jul. 15, 2003, Optical Society of America, pp. 1260–1262.

U.S. Patent Appl. No. 10/210,598, filed Jul. 31, 2002 entitled “Optical Fiber Coupler Having A Relaxed Alignment Tolerance,” Inventor: Christopher L. Coleman, 17 pages.

U. S. Patent Appl. No. 10/208,570 filed Jul. 30, 2002 entitled “Diffractive Optical Elements And Methods of Making the Same”, Inventors: James A. Matthew s, Wayne H. Grubbs, 18 pages.

U.S. Appl. No. 10/277,479 filed Oct. 22, 2002 entitled “Method for Sealing a Semiconductor Device and Apparatus Embodying the Method”, Inventor: Frank S. Geefay, 15 pages.

* cited by examiner

*Primary Examiner*—S. V. Clark

(57) ABSTRACT

A package for an optoelectronic device includes a hermetically sealed cavity into which a mirror or other optical element is integrated. For a side-emitting laser, an integrated mirror turns the light emitted from the laser inside the cavity so that the light exits through a top surface of the package. The packaging can be implemented for individual lasers or at the wafer level. A wafer level process fabricates sub-mounts in a first wafer, fabricates depressions with reflective areas in a second wafer, electrically connects optoelectronic devices to respective sub-mounts on the first wafer, and bonds a second wafer to the first wafer with the lasers hermetically sealed in cavities corresponding to the depressions in the second wafer. The reflective areas in the depressions act as turning mirrors for side emitting lasers.

28 Claims, 4 Drawing Sheets

OPTOELECTRONIC DEVICE PACKAGING WITH HERMETICALLY SEALED CAVITY AND INTEGRATED OPTICAL ELEMENT

This patent document is related to and hereby incorporates by reference in their entirety the following co-filed U.S. patent applications: Ser. No. 10/666,319 entitled "Alignment Post for Optical Subassemblies Made With Cylindrical Rods, Tubes, Spheres, or Similar Features"; Ser. No. 10/666,363, entitled "Wafer Level Packaging of Optoelectronic Devices", Ser. No. 10/666.442, entitled "Integrated Optics and Electronics"; Ser. No. 10/666,444, entitled "Methods to Make Diffractive Optical Elements"; Ser. No. 10/665,680, entitled "Optical Device Package With Turning Mirror and Alignment Post"; Ser. No. 10/665,662 entitled "Surface Emitting Laser Package Having Integrated Optical Element and Alignment Post"; and Ser. No. 10/665,660, entitled "Optical Receiver Package".

BACKGROUND

Semiconductor optoelectronic devices such as laser diodes for optical transceivers can be efficiently fabricated using wafer processing techniques. Generally, wafer processing techniques simultaneously form a large number (e.g., thousands) of devices on a wafer. The wafer is then cut to separate individual lasers. Simultaneous fabrication of a large number of lasers keeps the cost per laser low, but each laser generally must be packaged and/or assembled into a system that protects the laser and provides both electrical and optical interfaces for use of the devices on the laser.

Assembly of a package or a system containing an optoelectronic device is often costly because of the need to align multiple optical components with a semiconductor device. For example, the transmitting side of an optical transceiver laser may include a Fabry Perot laser that emits an optical signal from an edge of the laser. However, a desired path of the optical signal may require light to emerge from another direction, e.g., perpendicular to the face of a package. A turning mirror can deflect the optical signal from its original direction to the desired direction. Additionally, a lens or other optical element may be necessary to focus or alter the optical signal and improve coupling of the optical signal into an external optical fiber. Alignment of a turning mirror to the edge of the laser, the lens to the turning mirror, and an optical fiber to the lens can be a time consuming/expensive process.

Wafer-level packaging is a promising technology for reducing the size and the cost of the packaging of optoelectronic devices. With wafer-level packaging, components that conventionally have been separately formed and attached are instead fabricated on a wafer that corresponds to multiple packages. The resulting structures can be attached individually or simultaneously and later cut to separate individual packages.

Packaging techniques and structures that can reduce the size and/or cost of packaged optoelectronic devices are sought.

SUMMARY

In accordance with an aspect of the invention, a side-emitting laser is enclosed in a cavity formed between two wafers or substrates. One or more of the substrates can include passive or active electrical circuits that are connected to the laser. An optical element such as a turning mirror can also be integrated into a substrate, e.g. into a wall of the cavity formed in the substrate.

A wafer-level packaging process in accordance with an embodiment of the invention includes forming multiple cavities and turning mirrors on a first wafer and forming electrical device connections and/or active components on a second wafer. Optoelectronic devices are electrically connected to the device connections and are contained in respective cavities when the two wafers are bonded. The bonding can form a hermetic seal for protection of the optoelectronic devices. The structure including the bonded wafers is sawed or cut to produce separate packages or assemblies containing semiconductor optical devices.

One specific embodiment of the invention is an assembly including a laser, a sub-mount, and a cap with an integrated optical device. The laser is a device such as a Fabry Perot laser that emits an optical signal. The sub-mount contains electrical traces that are electrically connected to the device on the laser and lead to terminals for connection to external devices. The sub-mount may further contain active circuit elements such as an amplifier. The cap is attached to the sub-mount so as to form a cavity, preferably a hermetically sealed cavity, enclosing the laser. The integrated optical element is in a path of the optical signal from the laser when the cap is attached and does not require a separate alignment process.

When the laser emits the optical signal from an edge of the laser, the optical element can be a mirror positioned to reflect the optical signal from an initial direction as emitted from the laser to an output path (e.g., through the sub-mount). The mirror can be formed as a reflective portion of a wall of the cavity.

The cap is generally formed from a substrate such as a silicon substrate having a depression. The crystal structure of the substrate can be used to control the orientation of selected walls of the depression/cavity. In particular, a wall corresponding to the mirror formed by a reflective wall or a reflective coating on a portion of the walls can be along a <111> plane of the crystal structure of a silicon substrate. Anisotropic etching can provide a cavity wall with a smooth surface and the desired orientation.

Another embodiment of the invention is a method for packaging an optical device. The method generally includes: electrically connecting the optical device to a sub-mount; fabricating a cap that includes an optical element; and bonding the cap to the sub-mount. The optical device is thereby enclosed in a cavity between the sub-mount and the cap, and the optical element in the cap redirects an optical signal that is incident on the optical element from the optical device.

Fabricating the cap can be accomplished by creating (e.g., etching) a depression in a substrate and forming the optical element as a mirror corresponding to a reflective area on the walls of the depression. For a silicon substrate, the reflective area can coincide with a <111> plane of a crystal structure of the silicon.

Yet another embodiment of the invention is a wafer-level packaging process for lasers containing devices that emit optical signals. The process generally includes: electrically connecting lasers respectively to sub-mount areas of a first wafer; fabricating caps that each include an optical element; and bonding the caps to the first wafer. The lasers are thereby enclosed in respective cavities between the first wafer and the respective caps, and for each laser, the optical element in the corresponding cap is positioned to receive the optical signal from the laser. After bonding the caps to the first wafer, the resulting structure is cut or sawed to separate individual packages respectively containing the lasers, thus completing the process.

The caps can be formed as respective areas of a second wafer, so that bonding the caps to the wafer is actually bonding the first wafer to the second wafer. One method for fabrication of the caps includes creating (e.g., etching) depressions in a substrate and forming the optical elements as mirrors corresponding to reflective areas on the walls of respective depressions.

BRIEF DESCRIPTION OF THE DRAWINGS

Use of the same reference symbols in different figures indicates similar or identical items.

DETAILED DESCRIPTION

In accordance with an aspect of the invention, a package or assembly containing an optoelectronic device includes a sub-mount and a cap with an integrated optical element such as a turning mirror that redirects an optical signal from the semiconductor optical device. The optical signal from the optoelectronic device can thus be redirected to exit in a direction that is convenient for coupling into another optical device or an optical fiber.

A wafer-level fabrication process for these packages attaches a first wafer, which includes multiple caps, to a second wafer, which includes multiple sub-mounts. The optoelectronic devices reside and are electrically connected in multiple cavities formed by the bonding of the wafers. The cavities can be hermetically sealed to protect the enclosed devices. The structure including the bonded wafers is sawed to separate individual packages.

Figure 1:
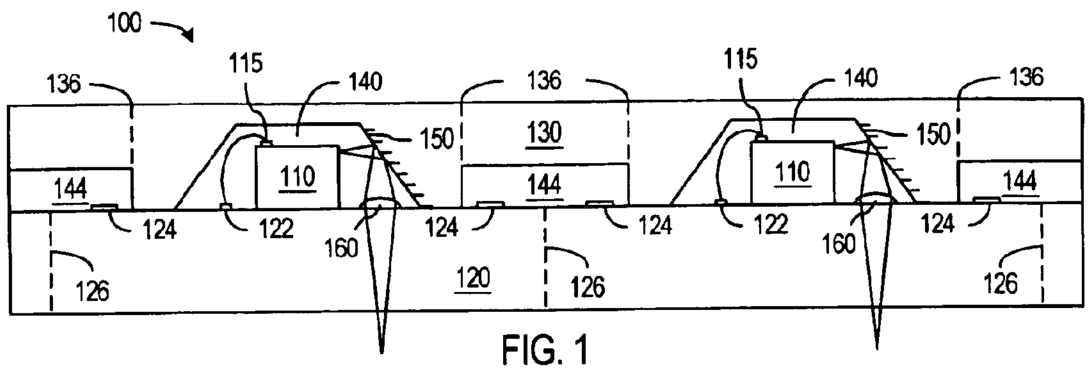
FIG. 1 shows a cross-section of a portion of a structure formed during a wafer-level packaging process for semiconductor optical devices in accordance with an embodiment of the invention employing wire bonding for electrical connections.

FIG. 1 shows a structure 100 produced during a wafer-level packaging process in accordance with one embodiment of the invention. Structure 100 includes multiple edge emitting lasers 110. Lasers 110 can be of a conventional design and manufactured using techniques that are well known in the art. In one specific embodiment, each laser 110 is a Fabry Perot laser for use in the transmitting section of an optical transmitter.

Each laser 110 is within one of the cavities 140 formed between a sub-mount wafer 120 and a cap wafer 130. In the embodiment of FIG. 1, lasers 110 are attached and electrically connected to sub-mount wafer 120. Lasers 110 can be glued or otherwise affixed in the desired location using conventional die attach equipment. In structure 100, wire bonding connects bonding pads 115 on lasers 110 to internal bonding pads 122 on wafer 120.

Wafer 120 is predominantly made of silicon and/or other materials that are transparent to the wavelength (e.g., 1100 nm or longer) of the optical signals from lasers 110. Wafer 120 also includes circuit elements such as bonding pads 122 and electrical traces or vias (not shown) that connect lasers 110 to external terminals 124. In the illustrated embodiment, external terminals 124 are on the top surface of sub-mount wafer 120, but the external terminals could alternatively be provided on the bottom surface. Additionally, active devices (not shown) such as transistors, an amplifier, or a monitor/sensor can be incorporated in wafer 120.

Cap wafer 130 is fabricated to include depressions or cavities 140 in areas corresponding to lasers 110 on sub-mount wafer 120 and saw channels 144 in areas over external terminals 124. Wafer 130 can be made of silicon or any convenient material that is suitable for formation of cavities 140 of the desired shape. Cavities 140 can be formed in a variety of ways including but not limited to forming, coining, ultrasonic machining, and (isotropic, anisotropic, or plasma) etching.

All or part of the surface of cap wafer 130 including cavities 140 is either reflective or coated with a reflective material so that reflectors 150 are integrated into cap wafer 130 in the required locations to reflect optical signals from lasers 110 to the desired direction. In an exemplary embodiment, deposition of a reflective metal forms reflectors 150, but the metal may be restricted to selected areas to avoid wicking when solder bonds wafers 120 and 130 together. Reflectors 150 can be planar to merely reflect or turn the optical signal to the desired direction but can alternatively be non-planar to provide beam shaping if desired.

In an exemplary embodiment, cap wafer 130 is silicon, and anisotropic etching of the silicon forms cavities 140 having very smooth planar facets on the <111> planes of the silicon crystal structure. Reflectors 150 are facets coated with a reflective material such as a Ti/Pt/Au metal stack. The preferred angle of reflectors 150 is 45° relative to the surface of wafer 130, so that reflectors 150 reflect optical signals that lasers 110 emit parallel to the surface of wafer 120 to a direction perpendicular to the surface of sub-mount wafer 120. A silicon wafer that is cut off-axis by 9.74° can be used to achieve a 45° angle for each reflector 150. However, etching silicon that is cut on-axis or off-axis at different angles can produce reflectors 150 at angles, which may be suitable for many applications.

Optionally, optical elements 160 such as lenses or prisms can be attached to or integrated into sub-mount wafer 120 along the paths of the optical signals from lasers 110. In FIG. 1, optical elements 160 are lenses that are integrated into wafer 120 and serve to focus the optical signals for better coupling into an optical fiber or other optical device not shown in FIG. 1. U.S. patent application Ser. No. 10/210, 598, entitled "Optical Fiber Coupler Having a Relaxed Alignment Tolerance," discloses bifocal diffractive lenses suitable for optical elements 160 when coupling of the optical signals into optical fibers is desired.

Sub-mount wafer 120 and cap wafer 130 are aligned and bonded together. A variety of wafer bonding techniques including but not limited to soldering, bonding by thermal compression, or bonding with an adhesive could be employed for attaching wafers 120 and 130. In the exemplary embodiment of the invention, soldering using a gold/tin eutectic solder attaches wafers 120 and 130 to each other and hermetically seals cavities 140. Hermaetic seals on cavities 140 protect the enclosed lasers 110 from environmental damage.

After wafers 120 and 130 are bonded, structure 100 can be cut to produce individual packages, each including a laser 110 hermetically sealed in a cavity 140. In particular, saw channels 144 permit sawing of cap wafer 130 along lines 136 without damaging underlying structures such as external terminals 124. After sawing cap wafer 130, sub-mount wafer 120 can be cut along lines 126 to separate individual packages.

Figure 2:
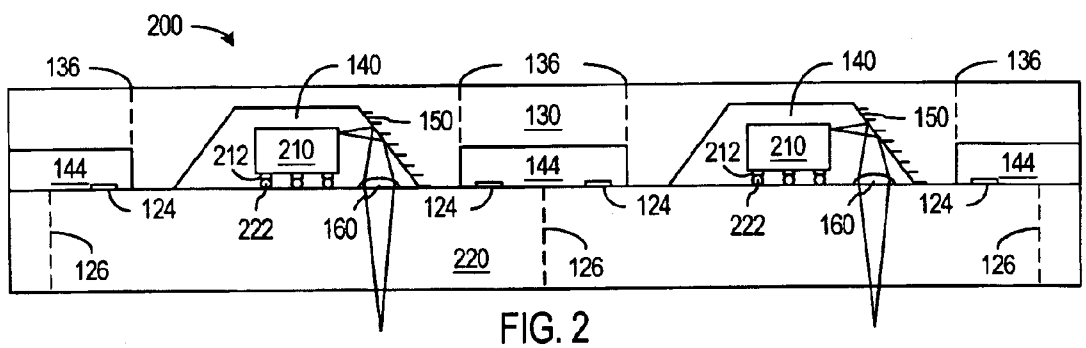
FIG. 2 shows a cross-section of a portion of a structure formed during a wafer-level packaging process for semiconductor optical devices in accordance with an embodiment of the invention employing flip-chip structures for electrical connections.

FIG. 2 illustrates a structure 200 in accordance with an alternative embodiment of the invention that uses flip-chip structures to attach lasers 210 to a sub-mount wafer 220. For flip-chip packaging, bonding pads 212 on lasers 210 are positioned to contact conductive pillars or bumps 222 on sub-mount wafer 220. Bumps 222 generally contain solder that can be reflowed to physically and electrically attach lasers 210 to wafer 220. An underfill (not shown) can also be used to enhance the mechanical integrity between laser 210 and the sub-wafer mount wafer 220. Other than the method for attachment and electrical connection of lasers 210 to wafer 220, structure 200 is substantially the same as structure 100 as described above.

Although FIGS. 1 and 2 illustrate structures formed during a wafer-level packaging process, similar techniques can be employed for a single edge-emitting laser where a reflector redirects an optical signal from the laser through a sub-mount.

Figure 3A:
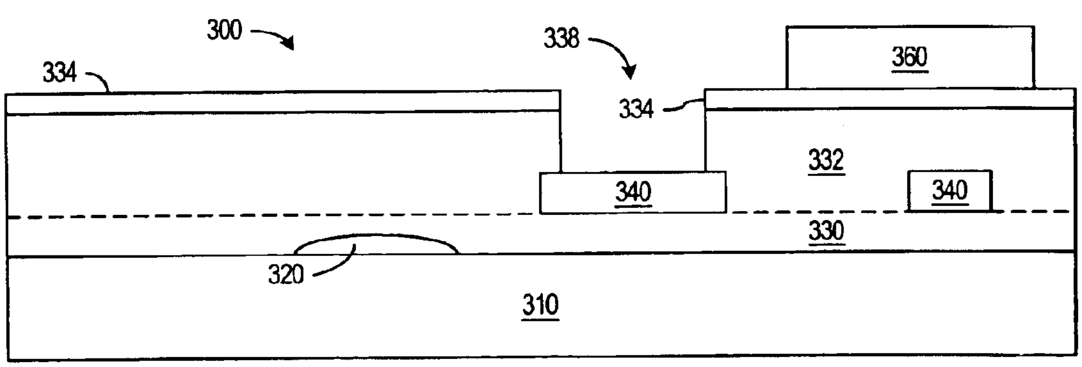
FIG. 3A shows a cross-section of a sub-mount for semiconductor optical device assembly in accordance with an embodiment of the invention.

FIG. 3A shows a cross-section of a sub-mount 300 for an optical device package in accordance with an illustrative embodiment of the invention. For a wafer-level packaging process, sub-mount 300 would be part of a sub-mount wafer and is only separated from other similar sub-mounts after bonding the sub-mount wafer as described above. Alternatively, for fabrication of a single package, sub-mount 300 can be separated from other similar sub-mounts before an optical device laser is attached to sub-mount 300.

Sub-mount 300 can be fabricated using wafer processing techniques such as those described in a co-filed U.S. pat. app. Ser. No. 10/666,442, entitled "Integrated Optics and Electronics". In the illustrated embodiment, sub-mount 300 includes a silicon substrate 310, which is transparent to optical signals using long wavelength light.

On silicon substrate 310, a lens 320 is formed, for example, by building up alternating layers of polysilicon and oxide to achieve the desired shape or characteristics of a diffractive or refractive lens. A co-filed U.S. pat. app. Ser. No. 10/664,444, entitled "Methods to Make Diffractive Optical Elements", describes some processes suitable for fabrication of lens 320.

A planarized insulating layer 330 is formed on silicon substrate 310 to protect lens 320 and to provide a flat surface on which the metallization can be patterned. In an exemplary embodiment of the invention, layer 330 is a TEOS (tetra-ethyl-ortho-silicate) layer about 10,000 Å thick.

Conductive traces 340 can be patterned out of a metal layer, e.g., a 10,000-Å thick TiW/AlCu/TiW stack. In an exemplary embodiment, a process that includes evaporating metal onto layer 330 and a lift-off process to remove unwanted metal forms traces 340. An insulating layer 332 (e.g., another TEOS layer about 10,000 Å thick) can be deposited to bury and insulate traces 340. The insulating layer can include openings 338, which are optionally covered with Au (not shown), to provide the ability to make electrical connections using wire bonding. Any number of layers of buried traces can be built up in this fashion. A passivation layer 334 of a relatively hard and chemical resistant material such as silicon nitride in a layer about 4500 Å thick can be formed on top of the other insulating layers to protect the underlying structure. For bonding/soldering to a cap, a metal layer 360 (e.g., a Ti/Pt/Au stack about 5,000 Å thick) is formed on passivation layer 334.

Figure 3B:
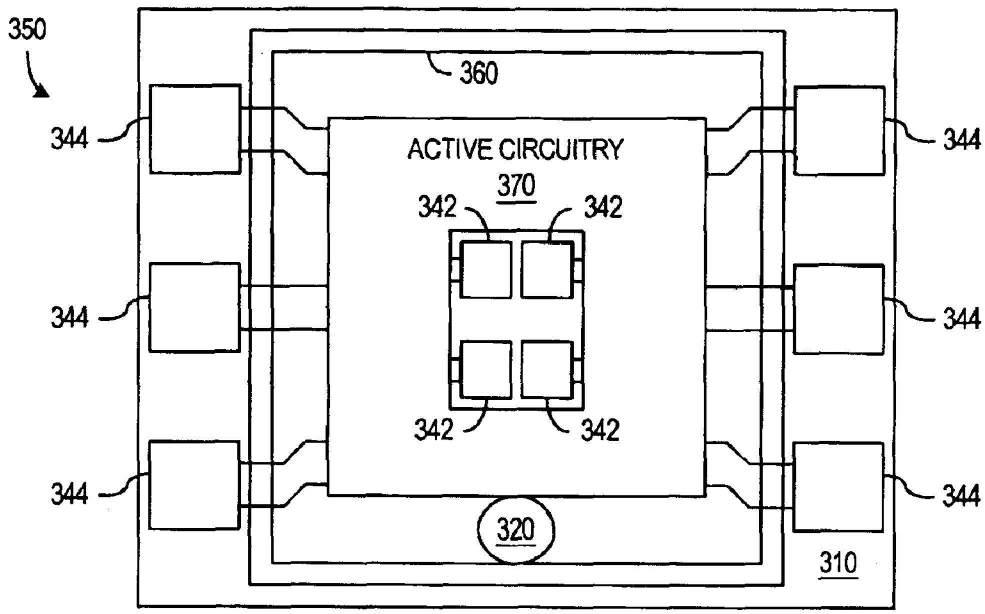
FIG. 3B shows a plan view of a sub-mount in accordance with an embodiment of the invention including active circuitry in the sub-mount.

The sub-mounts in the packages described above can incorporate passive or active circuitry. FIG. 3B illustrates the layout of a sub-mount 350 including a substrate 310 in and on which an active circuit 370 has been fabricated. Active circuit 370 can be used to process input or output signals from a laser or lasers that will be attached to sub-mount 350. Substrate 310 is a semiconductor substrate on which integrated active circuit 370 can be fabricated using standard IC processing techniques. Once circuit 370 is laid down, internal pads or terminals 342 for connection to an optoelectronic device and external bond pads or terminals 344 for connecting to the outside world are formed and connected to each other and/or active circuit 370. In the embodiment illustrated in FIG. 3B, external pads 344 accommodate I/O signals such as a power supply, ground, and data signals.

Optical element 320 is in an area of substrate 310 that is free of electronic traces or components to accommodate the reflected path of the optical signal.

Solder ring 360 for attaching a cap is formed between active circuit 370 and external bond pads 344. An individual cap that is sized to permit access to external bond pads 344 can be attached to solder ring 360. Alternatively, in a wafer-level packaging process where multiple caps are fabricated in a cap wafer, the cap wafer can be partially etched to accommodate external pads 344 before the cap wafer is attached to a sub-mount wafer.

Figure 4A:
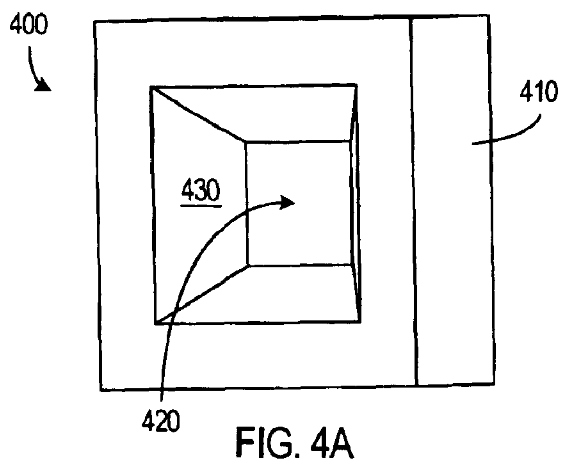
FIGS. 4A and 4B show perspective views of caps for semiconductor optical device packages in accordance with alternative embodiments of the invention.

FIG. 4A shows a perspective view of a cap 400 suitable for attachment to sub-mount 300 of FIG. 3A. Cap 400 can be fabricated using standard wafer processing techniques. In an exemplary embodiment of the invention, anisotropic etching of a silicon substrate 410 forms a cavity 420, which has a very smooth facet 430 on a <111 > plane of the silicon crystal structure. At least the target facet 430 of cavity 420 is reflective or coated with a reflective material (for example, a Ti/Pt/Au metal stack). This allows facet 430 of cap 400 to act as a reflector.

Figure 4B:
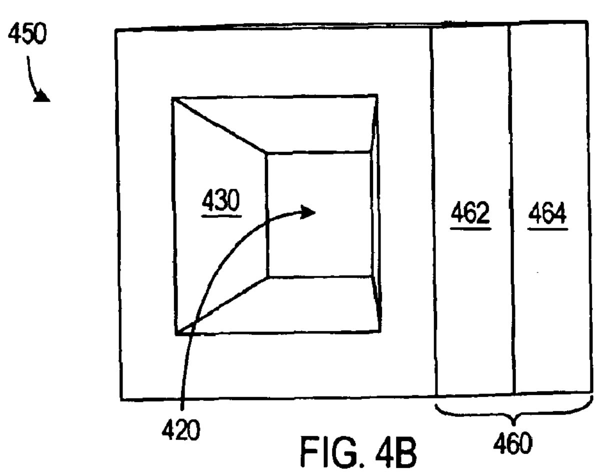

FIG. 4B shows a perspective view of a cap 450 in accordance with an alternative embodiment of the invention. Cap 450 includes a structure 460 that is composed of two layers including a standoff ring 462 and a backing plate 464. An advantage of cap 450 is that the two layers 462 and 464 can be processed differently and/or made of different materials. In particular, standoff ring 462 can be made of silicon that is etched all the way through to form a ring having planar mirror surfaces 430 at the desired angle, and backing plate 464 can be made of a material such as glass that is transparent to shorter light wavelengths.

To assemble an optical device package using sub-mount 300 and cap 400 or 450, a laser is mounted on sub-mount

300 using conventional die attach and wire-bonding processes or alternatively flip-chip packaging processes. Electrical connections to traces 340 on sub-mount 300 can supply power to the laser and convey data signals to or from the laser. Cap 400 or 450 attaches to sub-mount 300 after the laser is attached. This can be done either at the single package level or at a wafer level as described above. A hermetic seal can be obtained by patterning AuSn (or other solder) onto sub-mount 300 or cap 400, so that when the wafers are placed together, a solder reflow process creates a hermetic seal protecting the enclosed laser.

Figure 5:
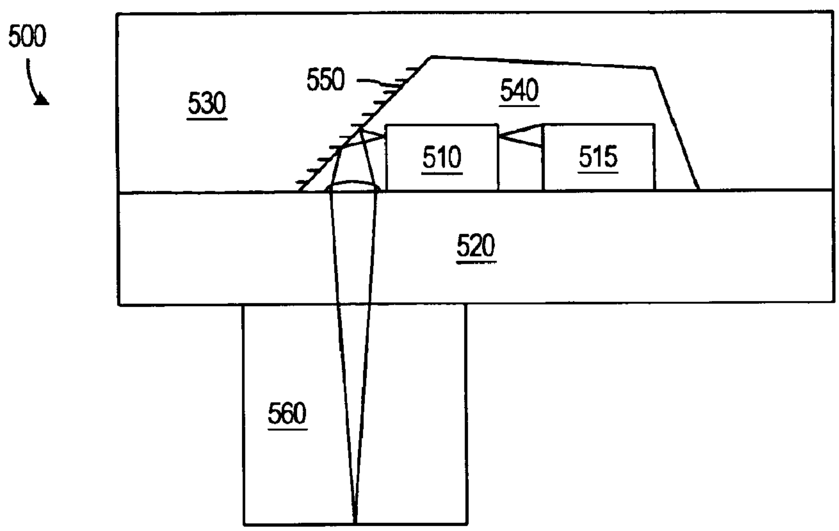
FIG. 5 shows an optical device package in accordance with an embodiment of the invention including a side-emitting laser, a cap with an integrated turning mirror, and an optical alignment post.

FIG. 5 illustrates an optical sub-assembly or package 500 in accordance with an embodiment of the invention. Package 500 includes an edge-emitting laser 510. Laser 510 is mounted on and electrically connected to a sub-mount 520 and is sealed in a cavity 540 that is hermetically sealed when a cap 530 is bonded to sub-mount 520. Cavity 540 illustrates a configuration in which cap 530 is made of silicon having a <100> plane at a 9.74° angle from its bottom and top major surfaces. Cap 540 can be wet etched so that the surface for a reflector 550 forms along a <111> plane of the silicon substrate and is therefore at a 45° angle with the major surfaces of cap 530 and sub-mount 520.

In accordance with an aspect of the invention, a monitor laser 515 is also mounted on and electrically connected to sub-mount 520. Monitor laser 515 contains a photodiode that measures the intensity of the optical signal from laser 510. This enables monitoring of the laser in laser 510 to ensure consistent output.

A post 560 is aligned to the optical signal that is emitted from laser 510 after reflection from reflector 550. In particular, post 560 can be epoxied in place on sub-mount 520 at the location that the light beam exits. Post 560 can take many forms including, but not limited to, a hollow cylinder or a solid structure such as a cylinder or a sphere of an optically transparent material. Post 560 acts as an alignment feature for aligning an optical fiber in a connector to the light emitted from the laser in package 500.

The above-described embodiments of the invention can provide a cap with a turning mirror for redirecting the optical signal from a side-emitting laser. However, aspects of the current invention can also be employed with other types of optoelectronic devices such as VCSELs (Vertical Cavity Surface Emitting Lasers.)

Figure 6:
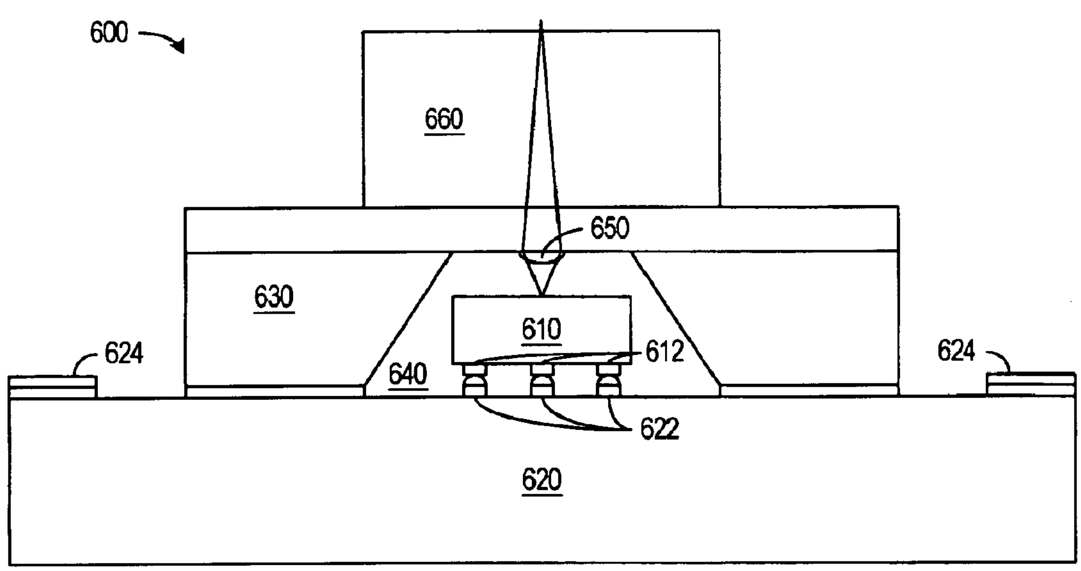
FIG. 6 shows an optical device package in accordance with an embodiment of the invention including a surface-emitting laser, a cap with an integrated optical element, and an optical alignment post.

FIG. 6 shows a semiconductor optical sub-assembly or package 600 for a surface-emitting laser 610. Laser 610 is mounted and electrically connected to a sub-mount 620. In particular, FIG. 6 shows an embodiment where flip-chip techniques are used to connect the electrical bonding pads 612 of laser 610 to respective conductive bumps 622 on sub-mount 620. Alternatively, wire bonding as described above could be used to connect a surface-emitting laser to a sub-mount.

Sub-mount 620 is a substrate that is processed to include external terminals 624 for external electrical connections. In one embodiment, sub-mount 620 include traces as illustrated in FIG. 3A that provide direct electrical connections between conductive bumps 622 and external terminals 624. Alternatively, sub-mount 620 can include active circuitry such as illustrated in FIG. 3B and described above.

A cap 630 is attached to sub-mount 620 using any of the techniques described above, and in a exemplary embodiment, solder bonds cap 630 to sub-mount 620. As a result, laser 610 is hermetically sealed in a cavity 640 between cap 630 and sub-mount 620. Cap 630 can be formed from a single substrate as illustrated in FIG. 4A or multi-layer structure as illustrated in FIG. 4B. However, since laser 610 is a surface-emitting laser rather than an edge-emitting laser, cap 630 does not require a turning mirror. Laser 610 directs the optical signal directly through cap 630. FIG. 6 shows an embodiment where an optical element 650, which is a diffractive or refractive lens, is formed in cap 630 to focus the optical signal.

A glass post 660 is epoxied on cap 630 where the optical signal emerges from cap 630. Glass post 660 acts as an alignment cue for aligning an optical fiber or other optical device to receive the light emitted from laser 610.

Figure 7:
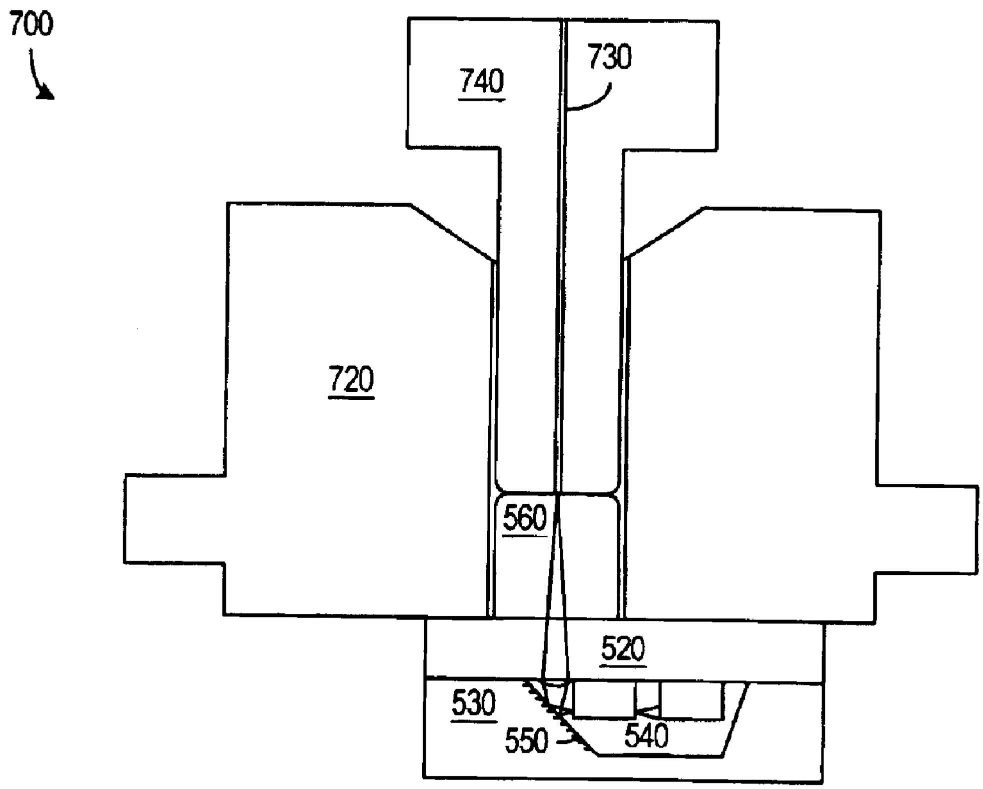
FIG. 7 shows the optical device package of FIG. 5 when assembled with a sleeve and an optical fiber connector.

FIG. 7 shows an optical assembly 700 containing sub-assembly 500 of FIG. 5. An optical assembly containing sub-assembly 600 could be of similar construction. Assembly 700 includes a sleeve 720 containing post 560 of package 500 and an optical fiber 730 in a ferrule 740. Ferrule 740 can be part of a conventional optical fiber connector (not shown). Sleeve 720 is basically a hollow cylinder having a bore that accepts both post 560 and ferrule 740. Accordingly, the inner diameter of one end of sleeve 720 can be sized to accept standard optical fiber ferrules. Such ferrules can be any size but are commonly 1.25 mm or 2.5 mm in diameter. For a uniform bore as shown in sleeve 720 of FIG. 7, post 560 has a diameter that matches the diameter of ferrule 740. Alternatively, the diameter of the bore in sleeve 720 can differ at each end to respectively accommodate post 560 and ferrule 740. In yet another alternative embodiment, the functions of sleeve 720 and ferrule 740 can be combined in a single structure that contains an optical fiber (e.g., having a typical bare diameter of about 125 $\mu$m) that is aligned with an opening that accommodates post 560 (e.g., having a diameter of about 1 mm or more.)

The top surface of post 560 acts as a fiber stop and controls the "z" positions of ferrule 740 and therefore of optical fiber 730 relative to laser 510. The length of post 560 is thus selected for efficient coupling of the optical signal from package 500 into the optical fiber abutting post 560. In particular, the length of post 560 depends on any focusing elements that may be formed in and on sub-mount 520.

The fit of post 560 and ferrule 740 in sleeve 720 dictates the position in an "x-y" plane of post 560 and optical fiber 730. In this way, optical fiber 730 is centered in the x-y plane relative to post 560, thereby centering the light emitted from laser 510 on optical fiber 730. Accordingly, proper positioning of a post 560 having the desired length during manufacture of sub-assembly 500 simplifies alignment of optical fiber 730 for efficient coupling of the optical signal.

Figure 8:
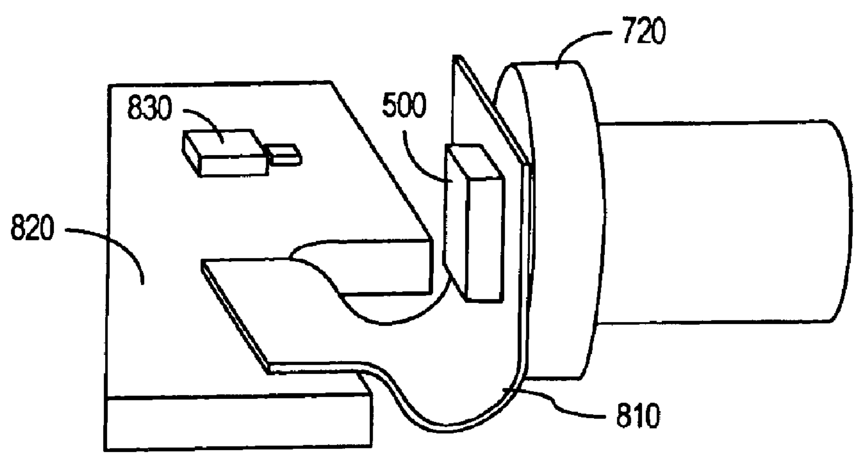
FIG. 8 shows an embodiment of the invention in which an optical assembly connects to a rigid circuit board via a flexible circuit.

External terminals package 500 or 600 are generally connected to a circuit board containing other components of an optical transmitter or an optical transceiver. FIG. 8 shows an embodiment of the invention in which terminals on the top surface of the package connect to a flexible circuit 810. Flexible circuit 810 is generally a flexible tape or substrate containing conductive traces that can be soldered to external terminals of package 500 or 600. A hole can be made through flexible circuit 810 to accommodate protruding structures such as post 560 or 660 and cap 530 or 630 of package 500 or 600. A rigid circuit board 820 on which other components 830 of the optical transmitter or transceiver are mounted electrically connects to the optoelectronic device in package 500 or 600 through the flexible circuit 810 and the sub-mount in the package. In an alternative embodiment of the invention, external terminals of a package 500 or 600 can be directly connected to a rigid circuit board, provided that the resulting orientation of sleeve 720 is convenient for an optical fiber connector.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A structure comprising:

an optoelectronic device;

a sub-mount containing electrical traces that are electrically connected to the optoelectronic device; and a cap attached to the sub-mount so as to form a cavity enclosing the optoelectronic device, wherein the cap includes an optical element positioned to reflect an optical signal between a path extending to the optoelectronic device and a path extending out of the structure.

2. The structure of claim 1, wherein the optoelectronic device comprises a side-emitting laser that emits the optical signal.

3. The structure of claim 2, wherein the optical element comprises a reflector positioned to reflect the optical signal from an initial direction to an output path that is substantially perpendicular to the initial direction.

4. The structure of claim 3, wherein the output path is through the sub-mount.

5. The structure of claim 3, wherein the reflector comprises a portion of a wall of the cavity.

6. The structure of claim 1, wherein the sub-mount further comprises:

internal bonding pads that are within the cavity and connected to the optoelectronic device; and external bonding pads that electrically connect to the internal bonding pads and are accessible outside the cavity.

7. The structure of claim 1, wherein the sub-mount further comprises active circuitry useful in operation of the optoelectronic device.

8. The structure of claim 1, wherein a bond of the cap to the sub-mount hermetically seals the cavity.

9. The structure of claim 8, wherein the optical element comprises a reflector on a portion of the walls of the cavity.

10. The structure of claim 1, wherein the cap comprises a silicon substrate including a depression that forms walls of the cavity.

11. The structure of claim 10, wherein the optical element comprises a portion of the walls that is along a <111> plane of the crystal structure of the silicon substrate.

12. A process comprising:

electrically connecting an optoelectronic device to a sub-mount;

fabricating a cap that includes an optical element; and bonding the cap to the sub-mount, wherein the optoelectronic device is enclosed in a cavity between the sub-mount and the cap and an optical signal of the optoelectronic device is incident on the optical element and there reflected between a path extending to the optoelectronic device and a path extending out of the cavity.

13. The process of claim 12, wherein fabricating the cap comprises:

creating a depression in a substrate, the depression having walls that correspond to walls of the cavity; and forming the optical element as a reflector corresponding to a reflective area on the walls of the depression.

14. The process of claim 13, wherein creating the depression comprises etching the substrate.

15. The process of claim 14, wherein the substrate comprises silicon, and the reflective area coincides with a <111> plane of a crystal structure of the silicon.

16. The process of claim 13, wherein forming the optical element comprises coating at least a portion of the walls of the depression with a reflective material.

17. A process comprising:

electrically connecting a plurality of lasers respectively to a plurality of sub-mount areas of a first wafer, wherein each laser emits an optical signal;

fabricating a plurality of caps, wherein each cap includes an optical element;

bonding the caps to the first wafer, wherein the lasers are enclosed in respective cavities between the first wafer and the respective caps, and for each of the lasers, the optical element in the corresponding cap is positioned to receive and reflect the optical signal from the laser onto an output path from the cavity; and dividing the resulting structure to separate a plurality of packages containing the lasers.

18. The process of claim 17, wherein the caps comprise respective areas of a second wafer, and bonding the caps to the wafer comprises bonding the second wafer to the first wafer.

19. The process of claim 18, wherein fabricating the caps comprises:

creating a plurality of depressions in the second wafer, wherein each depression has walls that correspond to walls of a corresponding one of the cavities; and forming the optical elements as reflectors corresponding to reflective areas on the walls of respective depressions.

20. The process of claim 19, wherein the second wafer comprises silicon, and each of the reflective areas coincides with a <111> plane of a crystal structure of the silicon.

21. A structure comprising:

an optoelectronic device;

a sub-mount containing electrical traces that are electrically connected to the optoelectronic device; and a cap made of silicon that attached to the sub-mount to form a cavity enclosing the optoelectronic device, wherein the cap includes a reflector that is in a path of an optical signal of the optoelectronic device and on a cavity wall along a <111> plane of the crystal structure of the silicon.

22. The structure of claim 21, wherein a bond of the cap to the sub-mount hermetically seals the cavity.

23. The structure of claim 21, wherein the optoelectronic device comprises a side-emitting laser.

24. The structure of claim 21, wherein the reflector directs the optical signal out of the structure in a direction that is perpendicular to a direction for which the optical signal emerges from the optoelectronic device.

25. A process comprising:

electrically connecting an optoelectronic device to a sub-mount;

fabricating a cap by etching a silicon substrate to create a depression, and forming a reflective area on a wall of the depression that coincides with a <111> plane of a crystal structure of the silicon substrate; and bonding the cap to the sub-mount, wherein the optoelectronic device is enclosed the depression and an optical signal of the optoelectronic device is incident on the reflective area.

26. The process of claim 25, wherein forming the reflective area comprises coating at least a portion of the wall of the depression with a reflective material.

27. The process of claim 25, further comprising:

electrically connecting a plurality of optoelectronic devices to the sub-mount, wherein each of the optoelectronic devices emits an optical signal; and etching a plurality of depressions in the silicon substrate, wherein each depression includes a reflective area, wherein bonding the cap to the sub-mount comprises bonding the silicon substrate to the sub-mount so that the optoelectronic devices are between the sub-mount and the silicon substrate and are respectively enclosed in the depressions, and for each of the optoelectronic devices, the reflective area in the corresponding depression is positioned in a path of the optical signal from the optoelectronic device.

28. The process of claim 27, further comprising dividing a structure including the sub-mount and the silicon substrate to separate a plurality of packages respectively containing the optoelectronic devices.

* * * * *